(12) United States Patent
Wu et al.

(10) Patent No.: US 9,123,980 B2
(45) Date of Patent: *Sep. 1, 2015

(54) FLEXIBLE TRANSMISSION DEVICE AND COMMUNICATION DEVICE USING THE SAME

(71) Applicant: MEDIATEK INC., Hsin-Chu (TW)

(72) Inventors: Min-Chung Wu, Taoyuan County (TW); Shao-Chin Lo, Miaoli County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/331,231

(22) Filed: Jul. 15, 2014

(65) Prior Publication Data

US 2014/0320380 A1    Oct. 30, 2014

Related U.S. Application Data

(63) Continuation of application No. 13/527,595, filed on Jun. 20, 2012, now Pat. No. 8,816,910.

(51) Int. Cl.
 *H01Q 1/24* (2006.01)
 *H01P 3/00* (2006.01)
 *H05K 1/02* (2006.01)
 *H05K 1/03* (2006.01)

(52) U.S. Cl.
 CPC .............. *H01P 3/003* (2013.01); *H05K 1/0221* (2013.01); *H05K 1/0393* (2013.01)

(58) Field of Classification Search
 CPC ..................................................... H05K 1/0393
 USPC ........................... 343/700 MS, 702, 767, 846
 See application file for complete search history.

(56) References Cited

U.S. PATENT DOCUMENTS

| 3,325,808 | A |   | 6/1967  | Manning |
|-----------|---|---|---------|---------|
| 4,528,568 | A | * | 7/1985  | Woloszczuk ................. 343/816 |
| 6,670,921 | B2 | * | 12/2003 | Sievenpiper et al. .. 343/700 MS |
| 6,759,986 | B1 |  | 7/2004  | Saliga |
| 6,879,849 | B2 |  | 4/2005  | Begic |
| 7,322,833 | B1 |  | 1/2008  | Hakansson |
| 7,525,503 | B2 | * | 4/2009  | Wong et al. ................... 343/846 |
| 8,044,867 | B2 | * | 10/2011 | Kikuchi et al. ............... 343/702 |
| 8,648,752 | B2 |  | 2/2014  | Ramachandran |
| 8,816,910 | B2 | * | 8/2014  | Wu et al. ................ 343/700 MS |

(Continued)

FOREIGN PATENT DOCUMENTS

| CN | 1574456 A | 2/2005 |
| CN | 201508548 U | 6/2010 |
| CN | 102055054 A | 5/2011 |

(Continued)

*Primary Examiner* — Tho G Phan
(74) *Attorney, Agent, or Firm* — Winston Hsu; Scott Margo (57) ABSTRACT

A flexible transmission device, for transmitting radio-frequency (RF) signals between a first communication module and a second communication module in a communication device, comprising a flexible substrate; a first metal sheet, formed on a plane of the flexible substrate and coupled between ground terminals of the first communication module and the second communication module; and a second metal sheet, formed on a plane of the flexible substrate different from the first metal sheet, and coupled between signal terminals of the first communication module and the second communication module, for transmitting the RF signals.

14 Claims, 10 Drawing Sheets

(56) References Cited

U.S. PATENT DOCUMENTS

2010/0045541 A1 2/2010 Aoki
2011/0122323 A1 5/2011 Kim

FOREIGN PATENT DOCUMENTS

CN 101887772 B 6/2012
CN 101433132 B 7/2012

\* cited by examiner

{}# FLEXIBLE TRANSMISSION DEVICE AND COMMUNICATION DEVICE USING THE SAME

CROSS REFERENCE TO RELATED APPLICATIONS

This application is a continuation application of a co-pending U.S. patent application Ser. No. 13/527,595, filed 2012 Jun. 20.

BACKGROUND

The present invention relates to a flexible transmission device and communication device using the same, and more particularly, to a flexible transmission device featuring thinness and flexibility and communication device using the same.

With the advances of technology, thin and small electronic products are expected. Therefore, assembly components of the electronic products also need to be thin and small otherwise will limit the thickness and the size of the electronic products.

However, in a laptop, a coaxial cable is generally used to connect an antenna and a communication module, for transmitting radio frequency (RF) signals between the antenna and the communication module. The diameter of the coaxial cable is 1.37 mm which may limit the thickness of the laptop. For example, if the antenna is placed behind a liquid crystal display (LCD) of the laptop, a housing of the laptop needs to include a thickness of the diameter of the coaxial cable otherwise the housing and the LCD may be broken during a pressure test, which means the diameter of the coaxial cable may limit the thickness of the laptop. In addition, in order to connect to the coaxial cable, the communication module needs a connector, which increases the manufacturing cost of the laptop and limits the layout of the laptop.

Therefore, if a transmission device with a thickness smaller than the diameter of the coaxial cable can to transmit the RF signals between the antenna and the communication module, the coaxial cable can be replaced and the thickness of the laptop can be further decreased. Besides, if the connected can be omitted from connecting the transmission device to the communication module, the layout of the electronic products can be more flexible and the manufacturing cost of the electronic products can be reduced.

SUMMARY

Therefore, the present invention discloses a flexible transmission device for transmitting radio frequency (RF) signals between two communication modules.

The present invention discloses a flexible transmission device, for transmitting radio-frequency (RF) signals between a first communication module and a second communication module in a communication device, comprising a flexible substrate; a first metal sheet, formed on a plane of the flexible substrate and coupled between ground terminals of the first communication module and the second communication module; and a second metal sheet, formed on a plane of the flexible substrate different from the first metal sheet, and coupled between signal terminals of the first communication module and the second communication module, for transmitting the RF signals.

The present invention further discloses a communication device, comprising: a first communication module; a second communication module; and a flexible transmission device, comprising a flexible substrate; a first metal sheet, formed on a plane of the flexible substrate and coupled between ground terminals of the first communication module and the second communication module; and a second metal sheet, formed on a plane the flexible substrate different from the first metal sheet, and coupled between signal terminals of the first communication module and the second communication module, for transmitting the RF signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
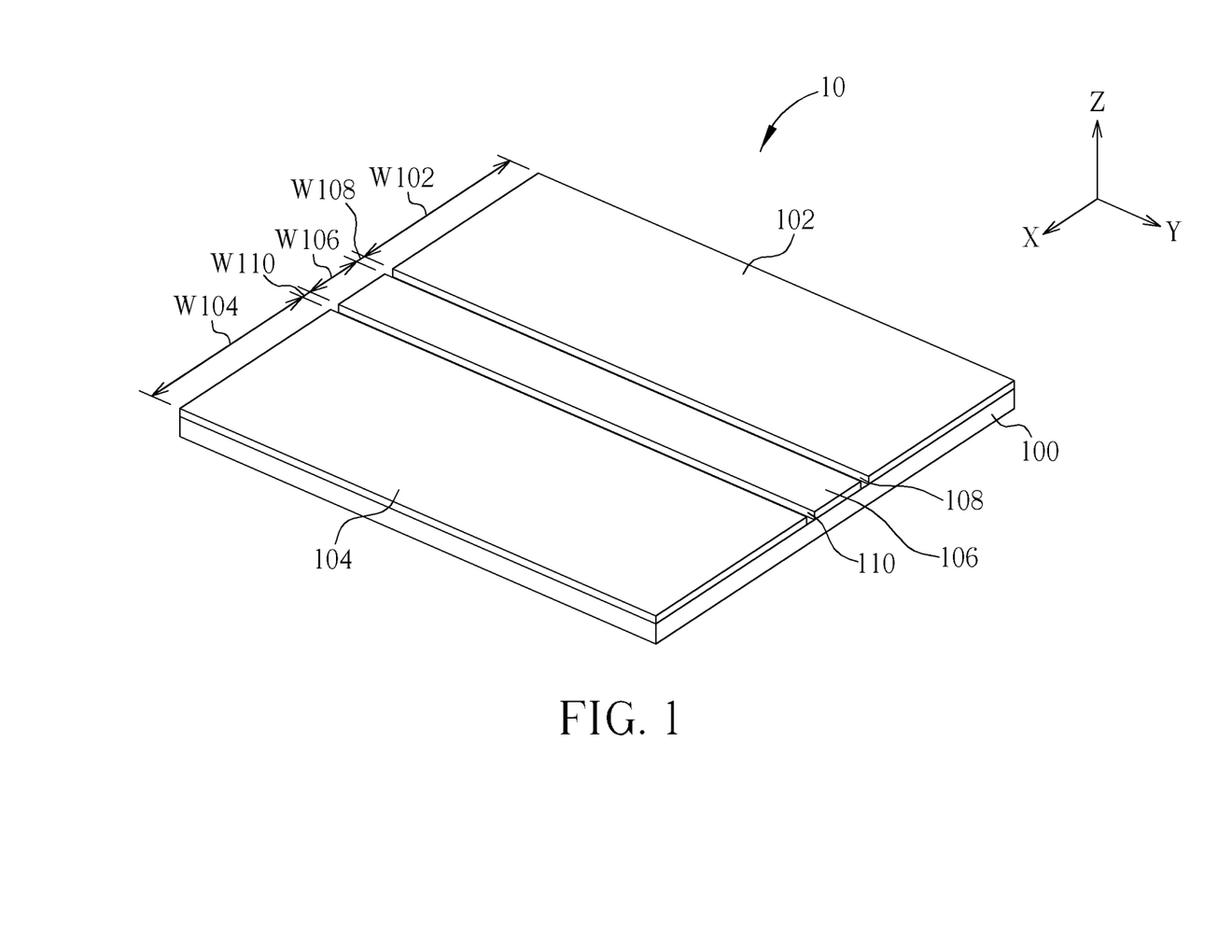
FIG. 1 is a schematic diagram of a flexible transmission device according to an embodiment of the present invention.

Please refer to FIG. 1, which is a schematic diagram of a flexible transmission device 10 according to an embodiment of the present invention. The flexible transmission device 10 is utilized for transmitting radio frequency (RF) signals between a first communication module (not shown) and a second communication module (not shown). The first communication module may be an antenna and the second communication module may be a communication module capable of processing the RF signals. As shown in FIG. 1, the flexible transmission device 10 comprises a flexible substrate 100, metal sheets 102-106, and slots 108, 110. The flexible substrate 100 can be a flexible printed circuit board featured thinness and flexibility. The metal sheets 102-106 are formed on a plane of the flexible substrate 100. The metal sheet 102 and the metal sheet 104 are coupled to ground terminals of the first communication module and the second communication module. The metal sheet 106 is formed between the metal sheet 102 and the metal sheet 104, and is utilized for transmitting the RF signals between the first communication module and the second communication module. The slot 108 is formed between the metal sheet 102 and the metal sheet 106. Similarly, the slot 110 is formed between the metal sheet 104 and the metal sheet 106. In comparison with the traditional coaxial cable, the thickness of the flexible transmission device 10 is much smaller, e.g. 0.3 mm, such that a transmission device features small thickness and flexibility can be achieved.

In detail, to acquire an excellent quality of transmitting the RF signals, an impedance IM106 of the metal sheet 106 (i.e. an impedance of the transmission path) of the flexible transmission device 10 needs to be a predetermined value determined by the impedances of the first communication module and the second communication module, e.g. 50 ohms, to eliminate the transmission line effect. The impedance IM106 is inversely proportional to a width W106 of the metal sheet 106, thus, the impedance IM106 can be adjusted to the predetermined value through changing the width W106. Similarly, the impedance IM106 is inversely proportional to a width W108 of the slot 108 and a width W110 of the slot 110. The impedance IM106 can be adjusted to the predetermined value through changing the width W108 and the width W110.

Figure 2A:
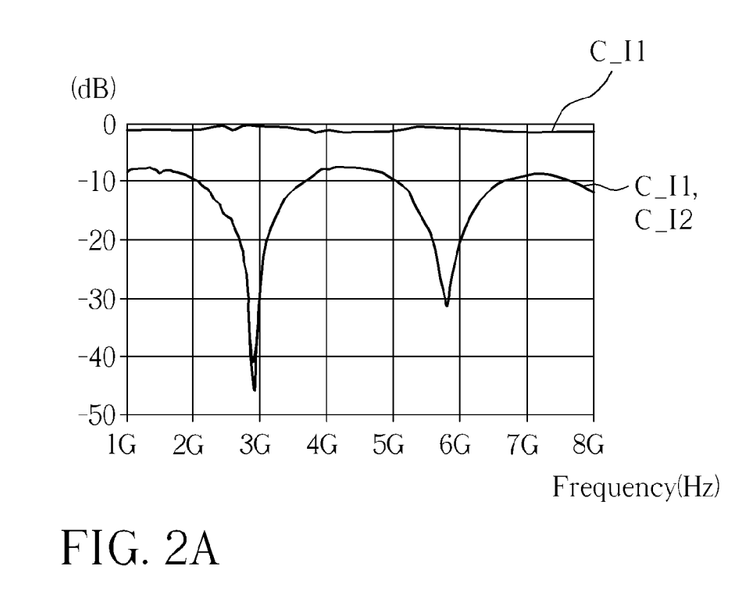
FIG. 2A is frequency response diagram of insertion loss and return loss of the flexible transmission device shown in FIG. 1 according to an embodiment.

For example, please refer to FIG. 2A, which is a schematic diagram of insertion loss and return loss of the flexible transmission device 10 according to an embodiment of the present invention. As shown in FIG. 2A, the flexible transmission device 10 is coupled between a communication module COM1 and a communication module COM2, and is designed to transfer the RF signals of 2.4 GHz and 5 GHz. The insertion loss and the return loss are tested by transmitting the RF signals between a port COM1a of the communication module COM1 and a port COM2a of the communication module COM2. The insertion loss between the port COM1a and the port COM2a is expressed by a curve C_I1. Similarly, the return loss of the port COM1a is expressed by a curve C_R1 and the return loss of the port COM2a is expressed by a curve C_R2. As can be seen from the curve C_I1, the insertion loss is lower than −2 dB from 1 GHz to 8 GHz. Besides, the return losses of the ports COM1a, COM2a are both under −10 dB as shown by curves C_R1, C_R2 when the frequency is 2.4 GHz and 5 GHz. Thus, the flexible transmission device 10 can be utilized for transmitting the RF signals between the communication module COM1 and the communication module COM2.

Figure 2B:
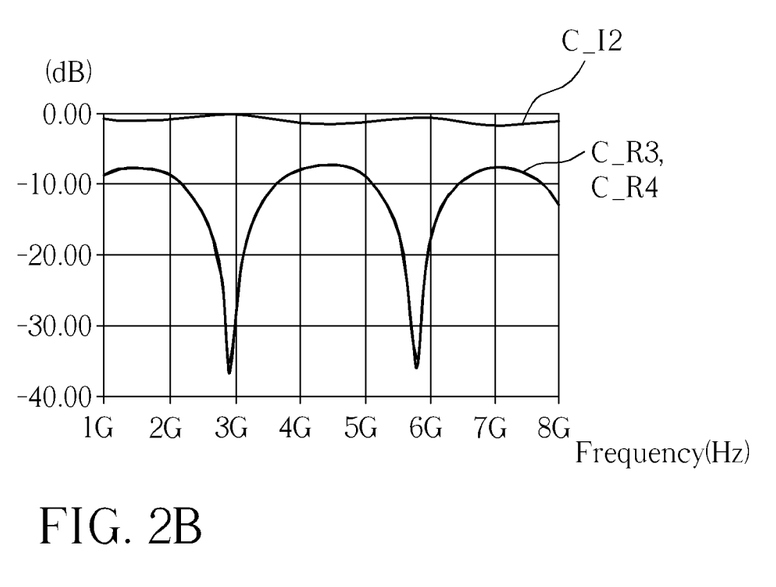
FIG. 2B is frequency response diagram of insertion loss and return loss of the flexible transmission device shown in FIG. 1 according to another embodiment.

In addition, please refer to FIG. 2B, which is a schematic diagram of insertion loss and return loss of the flexible transmission device 10 being bended according to another embodiment of the present invention. Different from the flexible transmission device 10 shown in FIG. 2A, the flexible transmission device 10 shown in FIG. 2B is bended while transmitting the RF signals. As can be seen from a curve C_I2 which is corresponding to the insertion loss between the port COM1a and the port COM2a, the insertion loss is still lower than −2 dB from 1 GHz to 8 GHz. Also, as can be seen from a curve C_R3 and a curve C_R4 which are respectively corresponding to the return loss of the port COM1a and the port COM2a, the return loss is substantially under −10 dB at 2.4 GHz and 5 GHz. Thus, the flexible transmission device 10 can be bended while transmitting the RF signals without significantly reducing performance of the flexible transmission device 10.

On the other hand, please refer to FIG. 1 again, the metal sheet 102 and the metal sheet 104 are formed on opposite sides of the metal sheet 106 for shielding the metal sheet 106, such that the loss of the RF signals can be reduced. Note that, correlation between the impedance IM106 and a width W102 of the metal sheet 102 or a width W104 of the metal sheet 104 are small. However, the width W102 and the width W104 should be as large as possible to get greater return loss while transmitting the RF signals.

Figure 3A:
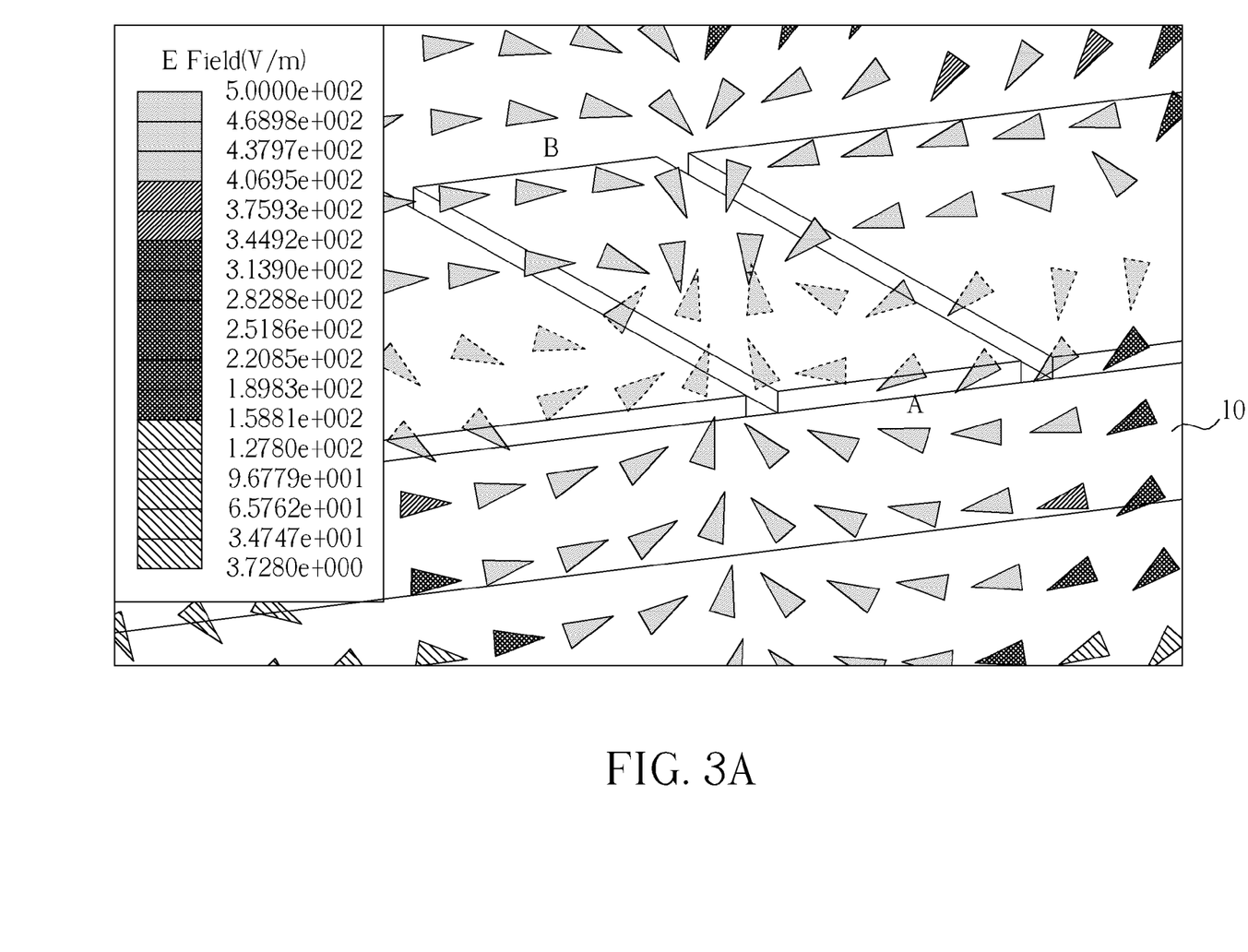
FIG. 3A is an electric field distribution diagram of the flexible transmission device shown in FIG. 1 when the flexible transmission device shown in FIG. 1 is operating.
Figure 3B:
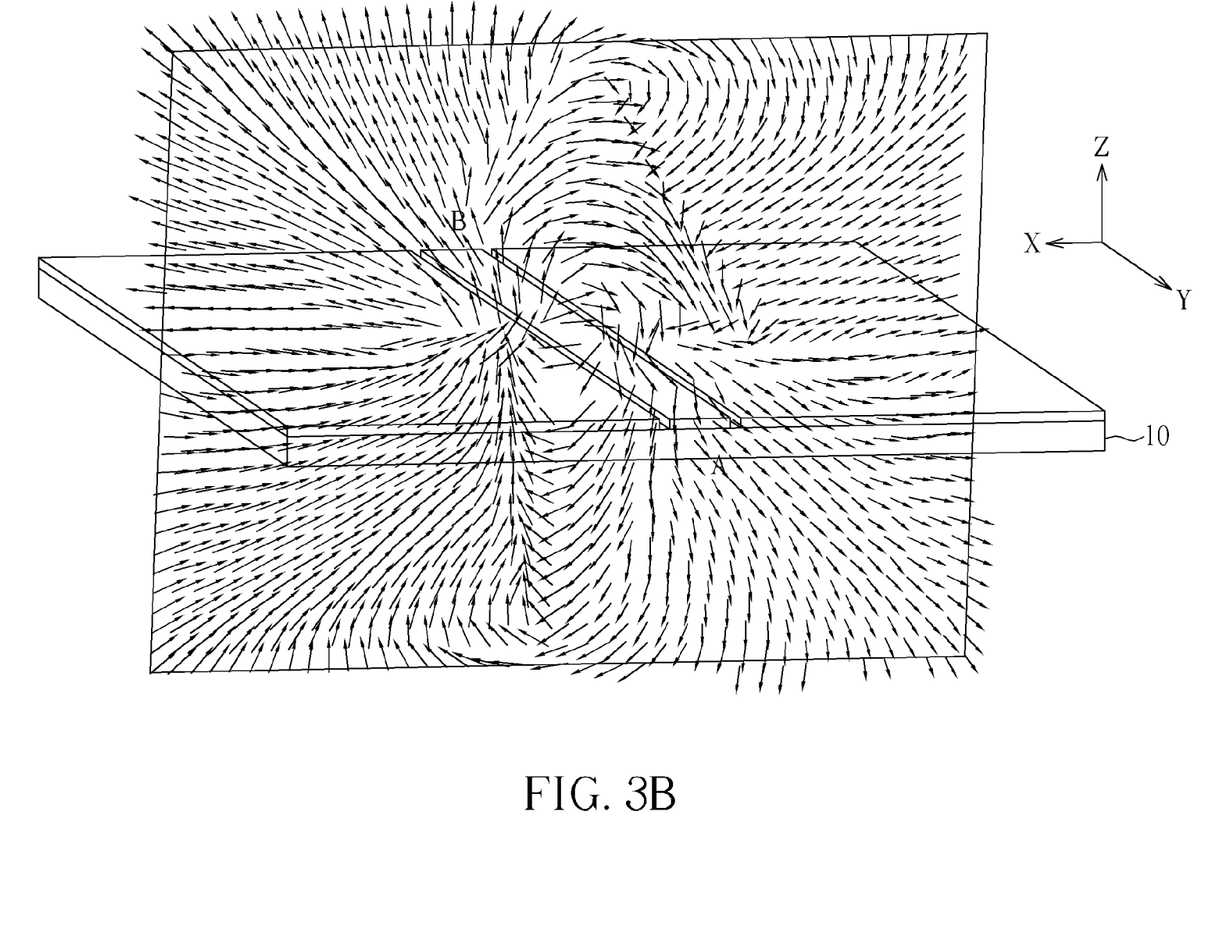
FIG. 3B is a magnetic field distribution diagram of the flexible transmission device shown in FIG. 1 when the flexible transmission device shown in FIG. 1 is operating.

In detail, an electric field and a magnetic field of the flexible transmission device 10 can be derived according to Maxwell equations. Please refer to FIG. 3A an FIG. 3B, which are respectively schematic diagrams of electric field distribution and magnetic field distribution when the flexible transmission device 10 is transmitting the RF signals from a point A to a point B along the y axis, i.e. from the first communication module to the second communication module. Please refer to FIG. 3A, the direction of the electric field is vertical to the surfaces of the metal sheet 106 and points from the metal sheet 102 to the metal sheet 106 and from the metal sheet 104 to the metal sheet 106. Please refer to FIG. 3B, the magnetic field clockwise circles the metal sheet 106 and the direction of the magnetic field parallels the surface of the metal sheet 106. As can be seen from FIG. 3A and FIG. 3B, the position of the strongest electric field is between the metal sheet 102 and the metal sheet 106 and between the metal sheet 104 and the metal sheet 106, i.e. the slot 108 and the slot 110.

Figure 3C:
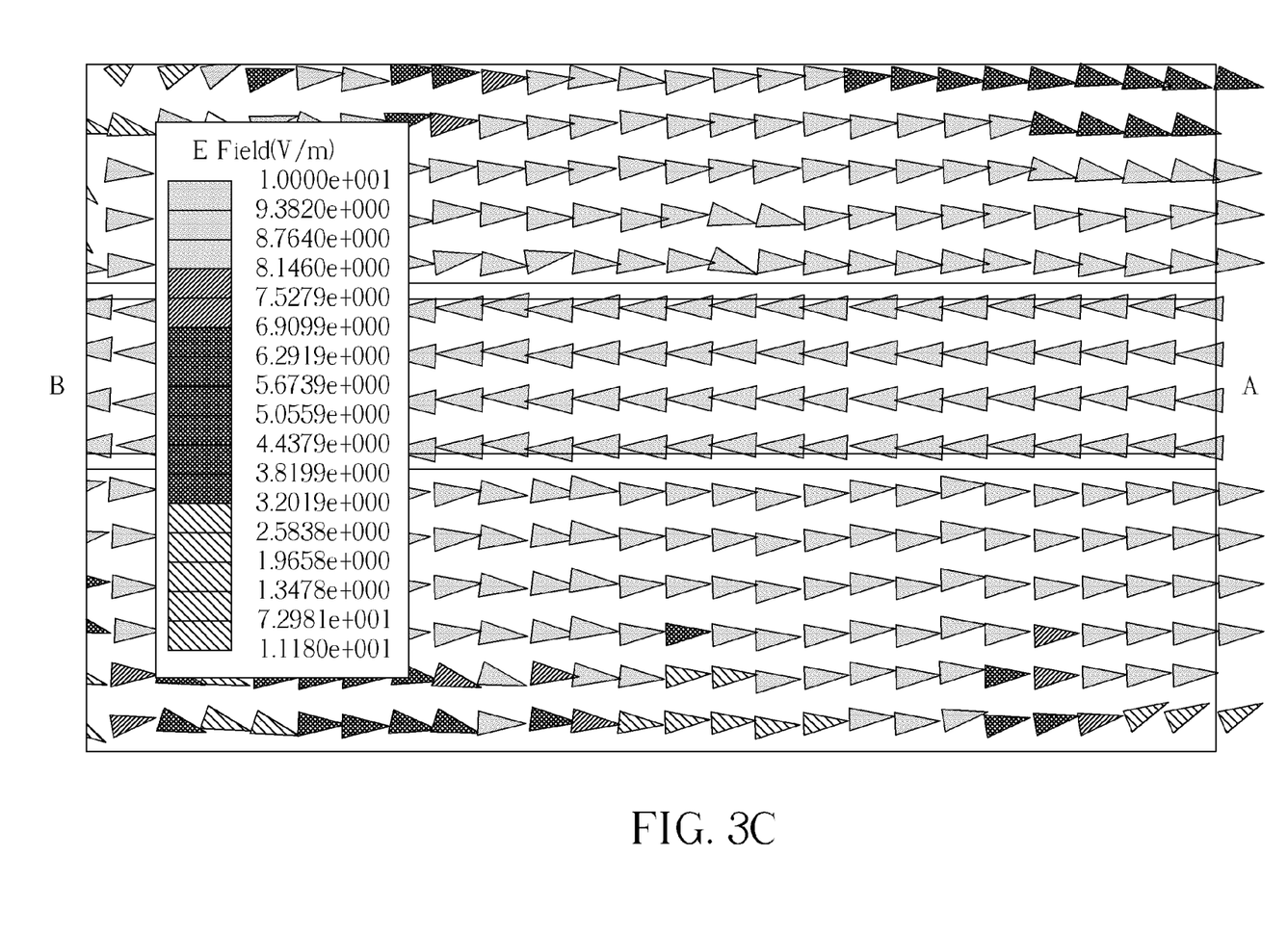
FIG. 3C is a current distribution diagram of the flexible transmission device shown in FIG. 1 when the flexible transmission device shown in FIG. 1 is operating.

Besides, please refer to FIG. 3C, which is a schematic diagram of current distribution when the flexible transmission device 10 is transmitting the RF signals from a point A to a point B along the y axis. As shown in FIG. 3C, the induced currents on the metal sheet 102 and the metal sheet 104 mass on the sides closed to the metal sheet 106. Therefore, the width W102 and the width W104 can be reduced without significantly changing the frequency response of the flexible transmission device 10.

Figure 4A:
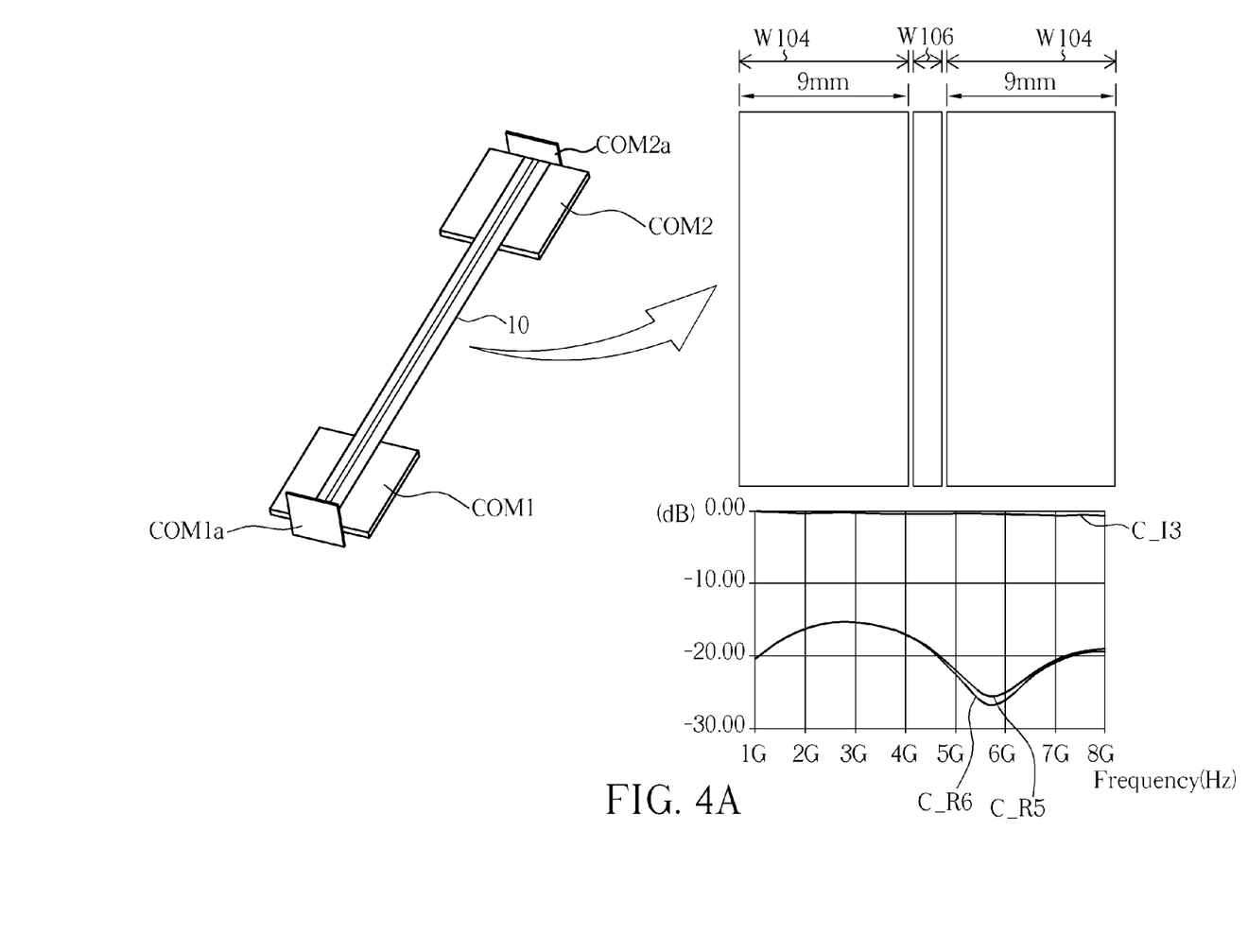
FIG. 4A is frequency response diagram of insertion loss and return loss of the flexible transmission device according to another embodiment of the present invention.
Figure 4B:
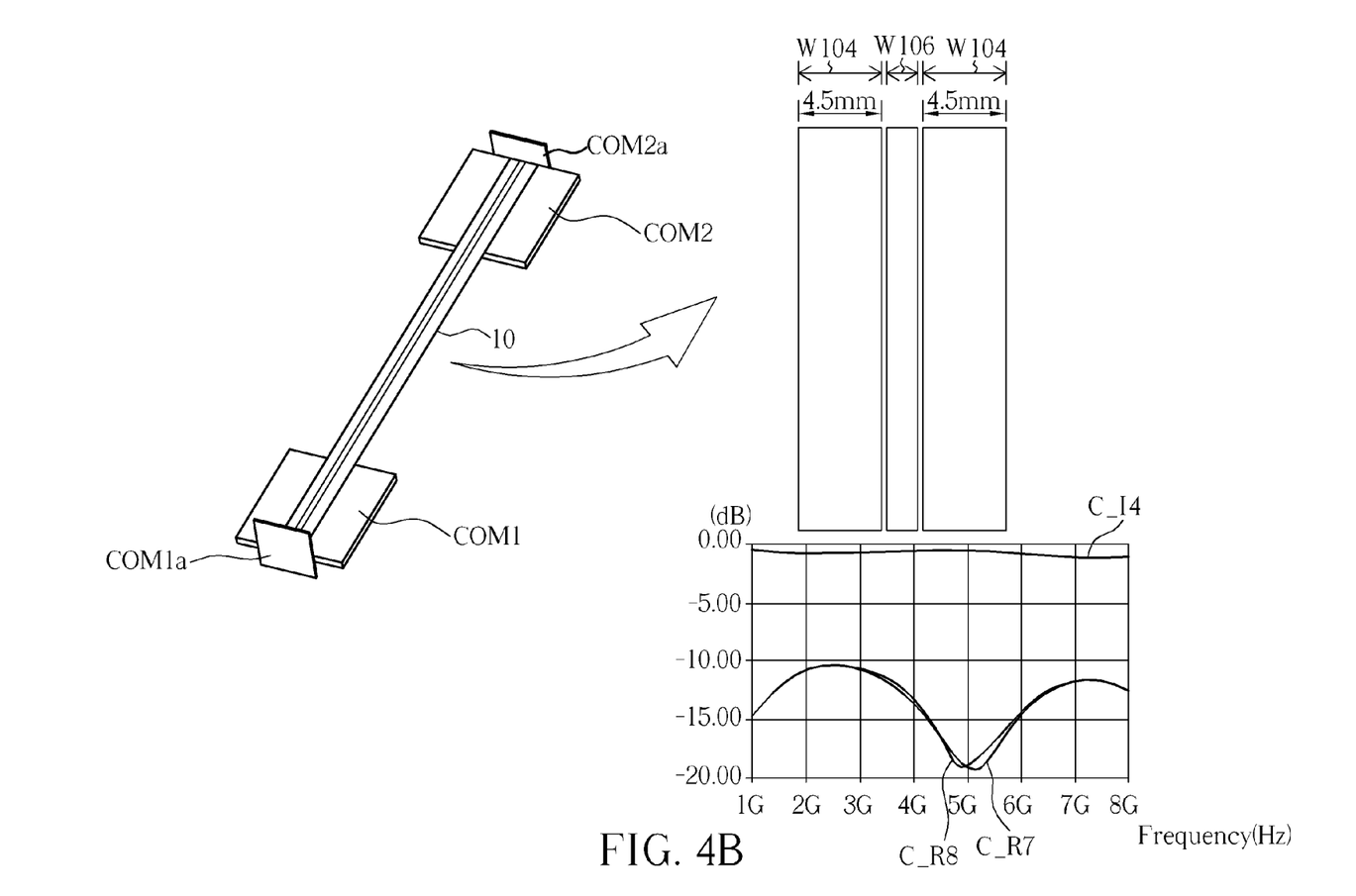
FIG. 4B is frequency response diagram of insertion loss and return loss of the flexible transmission device according to another embodiment of the present invention.

For example, please refer to FIG. 4A and FIG. 4B, which are schematic diagrams of insertion loss and return loss of a flexible transmission device 40a and a flexible transmission device 40b according to different embodiments of the present invention. Structures of the flexible transmission device 40a and the flexible transmission device 40b are the same with that of the flexible transmission device 10, and the same symbols are used therefore. The insertion loss and the return loss shown in FIG. 4A and FIG. 4B are tested by transmitting the RF signals between the port COM1a of the communication module COM1 and the port COM2a of the communication module COM2 via the flexible transmission device 40a and the flexible transmission device 40b.

Please refer to FIG. 4A, the width W102 and the width W104 of the flexible transmission device 40a are 9 mm. A curve C_I3 corresponding to the insertion loss is substantially 0 dB from 1 GHz to 8 GHz. A curve C_R5 and a curve C_R6, which are respectively corresponding to the return loss of the port COM1a and the port COM2a, are lower than −10 dB from 1 GHz to 8 GHz. In comparison, as shown in FIG. 4B, the width W102 and the width W104 of the flexible transmission device 40b are reduced to 4.5 mm, and other conditions such as the widths W106, W108 and W110 are the same to those of the flexible transmission device 40a. A curve C_I4 corresponding to the insertion loss is substantially 0 dB from 1 GHz to 8 GHz. A curve C_R7 and a curve C_R8, which are respectively corresponding to the return loss of the port COM1a and the port COM2a, are lower than −10 dB from 1 GHz to 8 GHz. As can be seen from FIG. 4A and FIG. 4B, the insertion loss and the return loss are not significantly changed when reducing the width W102 and the width W104, i.e. the width W102 and the width W104 can be decreased without significantly reducing performance of transmitting the RF signals.

Noticeably, the embodiments of the present invention utilize metal sheets formed on a flexible printed circuit board to transmit RF signals between two communication modules.

According to different applications, those skilled in the art can observe appropriate alternations and modifications.

Figure 5:
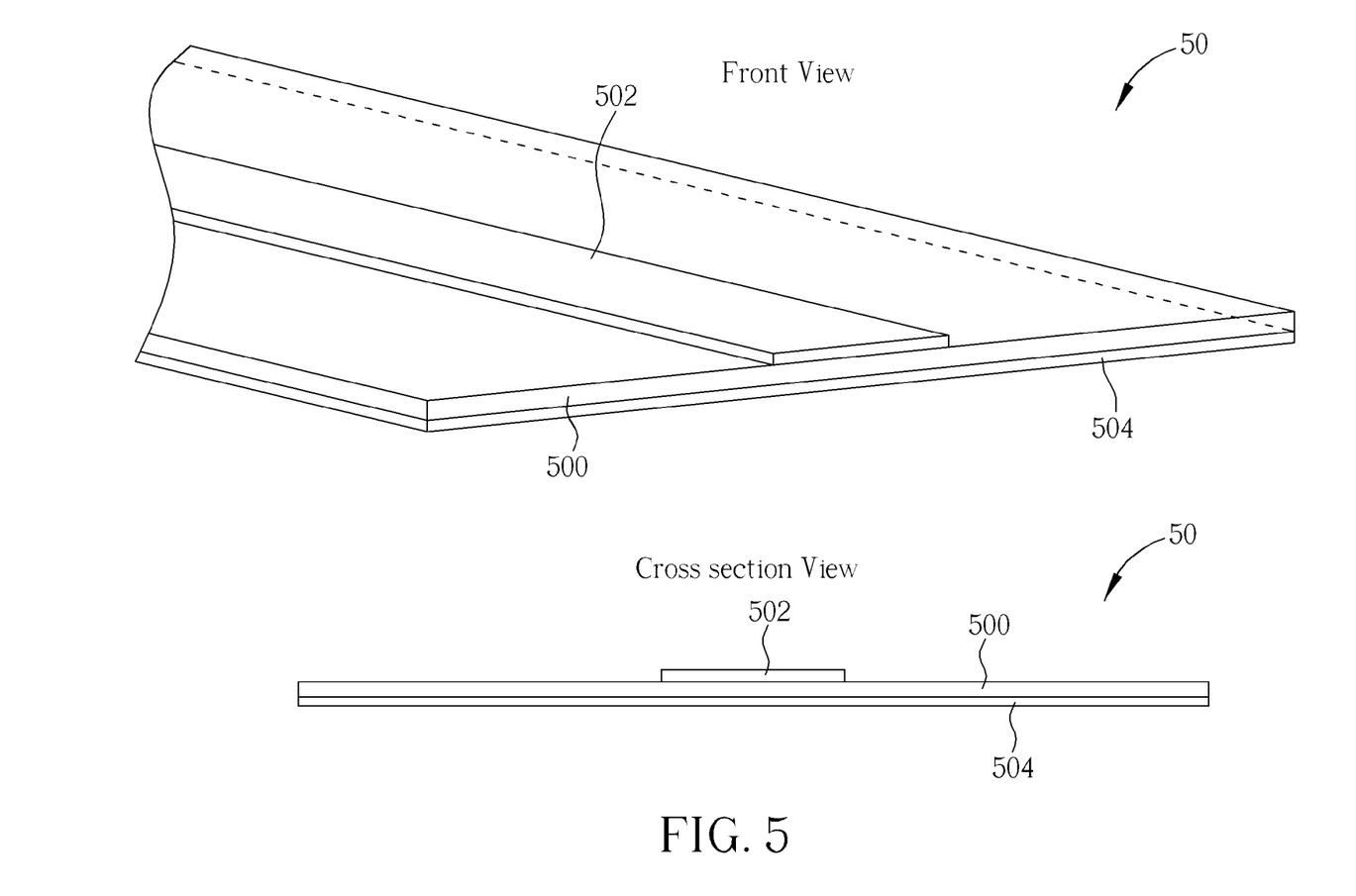
FIG. 5 is a schematic diagram of a flexible transmission device according to another embodiment of the present invention.

For example, please refer to FIG. 5, which is a schematic diagram of a flexible transmission device 50 according to another embodiment of the present invention. Similar to the flexible transmission device 10, the flexible transmission device 50 is utilized for transmitting the RF signals between the first communication module and the second communication module (not shown). As shown in FIG. 5, the flexible transmission device 50 comprises a flexible printed circuit board 500, a metal sheet 502 and a metal sheet 504. The flexible board 500 and the metal sheet 502 are similar to the flexible board 100 and the metal sheet 106 of the flexible transmission device 10. Different from the flexible transmission device 10, the metal sheet 504 (i.e. the metal sheet coupled to the ground terminals of the first communication module and the second communication module) is formed on a plane other than the plane the metal sheet 502 (i.e. the metal sheet utilized for transmitting the RF signals) is formed on. The flexible transmission device 50 also features thinness and flexibility and can be utilized for transmitting the RF signals between two communication modules.

Figure 6:
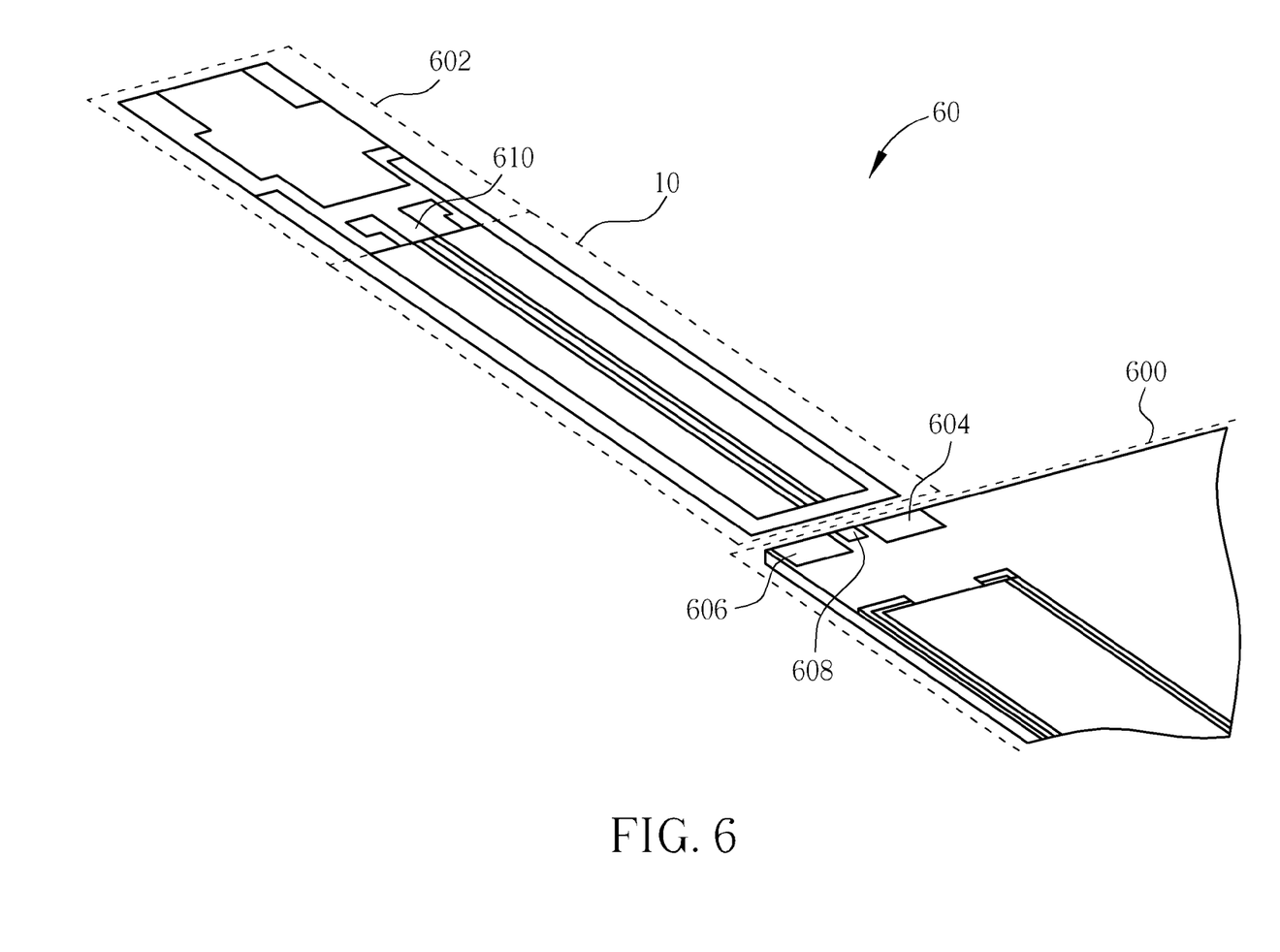
FIG. 6 is a schematic diagram of a communication device according to an embodiment of the present invention.

On the other hand, as to utilization of the flexible transmission device 10, please refer to FIG. 6, which is a schematic diagram of a communication device 60 according to an embodiment of the present invention. The communication device 60 comprises a communication module 600, an antenna 602 and the flexible transmission device 10. The communication module 600 comprises ground terminals 604, 606 and an output terminal 608, and is utilized for processing and transmitting/receiving the RF signals. The antenna 602 comprises an input terminal 610, and is utilized for transmitting/receiving the RF signals. In this embodiment, the antenna 602 is formed on the same flexible substrate 100 of the flexible transmission device 10, but is not limited thereto. The flexible transmission device 10 is utilized for transmitting the RF signals between the communication module 600 and the antenna 602. The function and the structure of the flexible transmission device 10 can be derived by referring to the above descriptions, and is not narrated hereinafter.

In addition, since the antenna 602 and the flexible transmission device 10 are formed on the same flexible substrate 100, the input terminal 610 and metal sheet 106 of the flexible transmission device 10 can be directly coupled together. Furthermore, the ground terminal 604, the ground terminal 606, and the output terminal 608 are separately coupled to the metal sheet 102, metal sheet 104, and the metal sheet 106 by soldering. Thus, the communication device 60 does not need a connector and the manufacture cost of the communication device 60 can be reduced.

To sum up, the flexible transmission device features thinness and flexibility is disclosed. In comparison with the prior art, the flexible transmission device of the present invention allows the design of the electric products to be more flexible and thinner. Furthermore, without using connector, the manufacture cost of the electric products can be further decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flexible transmission device, for transmitting radio-frequency (RF) signals between a first communication module and a second communication module in a communication device, comprising:
   a flexible substrate;
   a first metal sheet, formed on a plane of the flexible substrate and coupled between ground terminals of the first communication module and the second communication module; and
   a second metal sheet, formed on a plane of the flexible substrate different from the first metal sheet, and coupled between signal terminals of the first communication module and the second communication module, for transmitting the RF signals.

2. The flexible transmission device of claim 1, wherein an impedance of the second metal sheet is inversely proportional to a width of the second metal sheet.

3. The flexible transmission device of claim 1, wherein the first communication module is an antenna.

4. The flexible transmission device of claim 3, wherein the antenna is formed on the flexible substrate.

5. The flexible transmission device of claim 1, wherein the second communication module is an RF processing unit for processing the RF signals.

6. The flexible transmission device of claim 1, wherein the second metal sheet are coupled to the first communication module and the second communication module by soldering.

7. The flexible transmission device of claim 1, wherein the first metal sheet is further coupled between the ground terminals of the first communication module and the second communication module by soldering.

8. A communication device, comprising:
   a first communication module;
   a second communication module; and
   a flexible transmission device, comprising:
      a flexible substrate;
      a first metal sheet, formed on a plane of the flexible substrate and coupled between ground terminals of the first communication module and the second communication module; and
      a second metal sheet, formed on a plane of the flexible substrate different from the first metal sheet, and coupled between signal terminals of the first communication module and the second communication module, for transmitting the RF signals.

9. The communication device of claim 8, wherein an impedance of the second metal sheet is inversely proportional to a width of the second metal sheet.

10. The communication device of claim 8, wherein the first communication module is an antenna.

11. The communication device of claim 10, wherein the antenna is formed on the flexible substrate.

12. The communication device of claim 8, wherein the second communication module is an RF processing unit for processing the RF signals.

13. The communication device of claim 8, wherein the second metal sheet are coupled to the first communication module and the second communication module by soldering.

14. The communication device of claim 8, wherein the first metal sheet is further coupled between the ground terminals of the first communication module and the second communication module by soldering.

* * * * *